(12) United States Patent
Okoshi et al.

(10) Patent No.: US 7,535,721 B2
(45) Date of Patent: May 19, 2009

(54) CASING FOR ELECTRONIC DEVICE AND PROJECTOR HAVING THIS CASING FOR ELECTRONIC DEVICE

(75) Inventors: Masayuki Okoshi, Matsumoto (JP); Akira Momose, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 161 days.

(21) Appl. No.: 11/059,486

(22) Filed: Feb. 17, 2005

(65) Prior Publication Data

US 2005/0185386 A1 Aug. 25, 2005

(30) Foreign Application Priority Data

Feb. 20, 2004 (JP) ............... 2004-044607

(51) Int. Cl.
*H05K 5/00* (2006.01)

(52) U.S. Cl. .................. 361/752; 361/810

(58) Field of Classification Search ............ 174/138 G, 174/138 E, 138 D; 361/810, 758, 770, 804, 361/752

See application file for complete search history.

(56) References Cited

U.S. PATENT DOCUMENTS

| | | | |
|---|---|---|---|
| 5,913,605 A * | 6/1999 | Jusselin et al. ............ 37/451 |
| 6,249,442 B1 * | 6/2001 | Watanabe .................. 361/801 |
| 6,280,202 B1 * | 8/2001 | Alden et al. ................ 439/66 |
| 7,034,223 B2 * | 4/2006 | Fan et al. .................. 174/51 |
| 2007/0008709 A1 * | 1/2007 | Ikeya et al. ................ 361/810 |

FOREIGN PATENT DOCUMENTS

| | | | |
|---|---|---|---|
| GB | WO-97/23934 | * | 3/1997 |
| JP | U 3095453 | | 5/2003 |
| JP | U3095453 | * | 5/2003 |

* cited by examiner

*Primary Examiner*—Dean A. Reichard
*Assistant Examiner*—Yuriy Semenenko
(74) *Attorney, Agent, or Firm*—Oliff & Berridge, PLC

(57) ABSTRACT

A casing for electronic device having a casing body for housing an electronic device and a foot part provided to be movable forward to and backward from a surface of the casing body and adapted to adjust inclination of the electronic device, the casing body has a boss that is formed to protrude on the inner surface of the casing body and in which a hole connecting the inside and outside of the casing body is formed, and the foot part has a grounding part exposed from the casing for an electronic device and abutted against an installation target surface and a shaft part housed within the boss and having a screw groove formed on its outer circumferential surface. A recess part is formed at a part of the screw groove of the shaft part, and on the inner surface of the boss, a screw thread that engages with the screw groove of the shaft part and extends in a circumferential direction of engagement without overlapping a circumference of the hole as viewed from the axial direction of movement of the foot part, and a protrusion that fits in the recess part when the shaft part turns by a predetermined quantity in relation to the inner surface of the boss, are formed.

5 Claims, 9 Drawing Sheets

F I G. 7
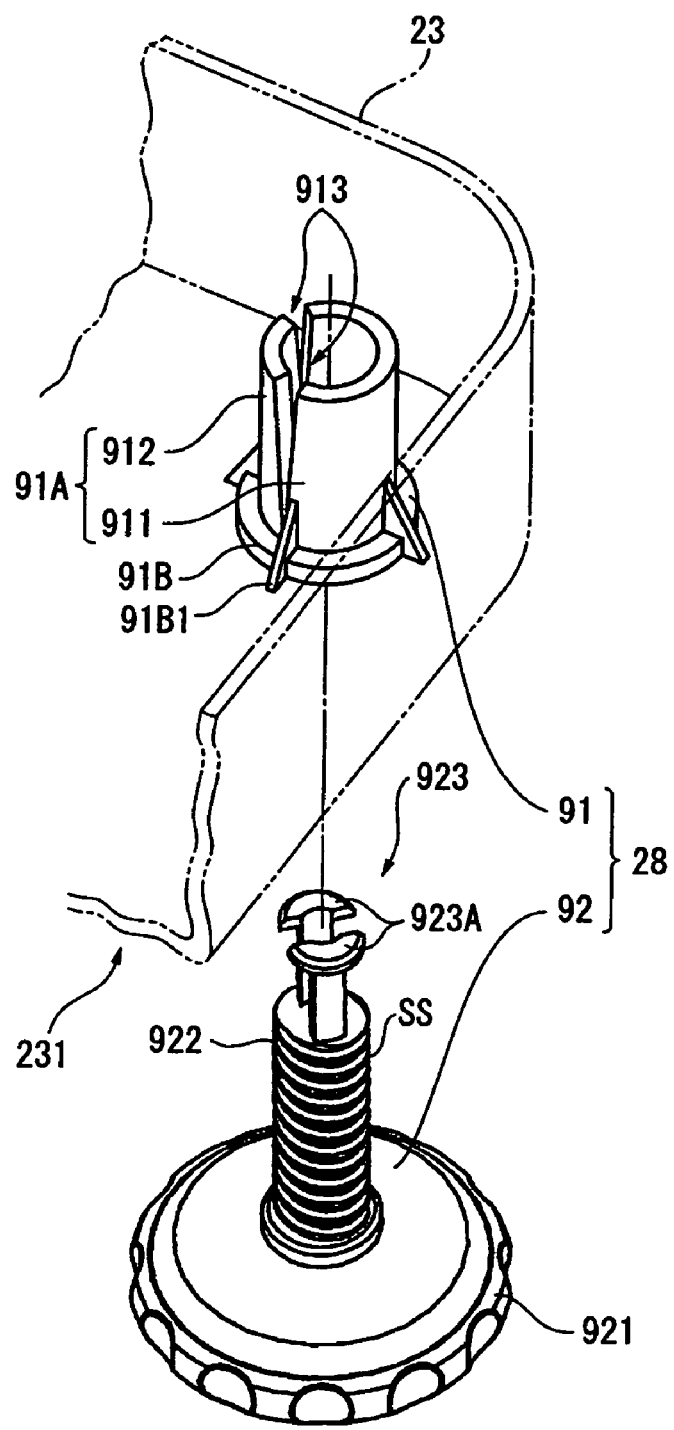

F I G. 8
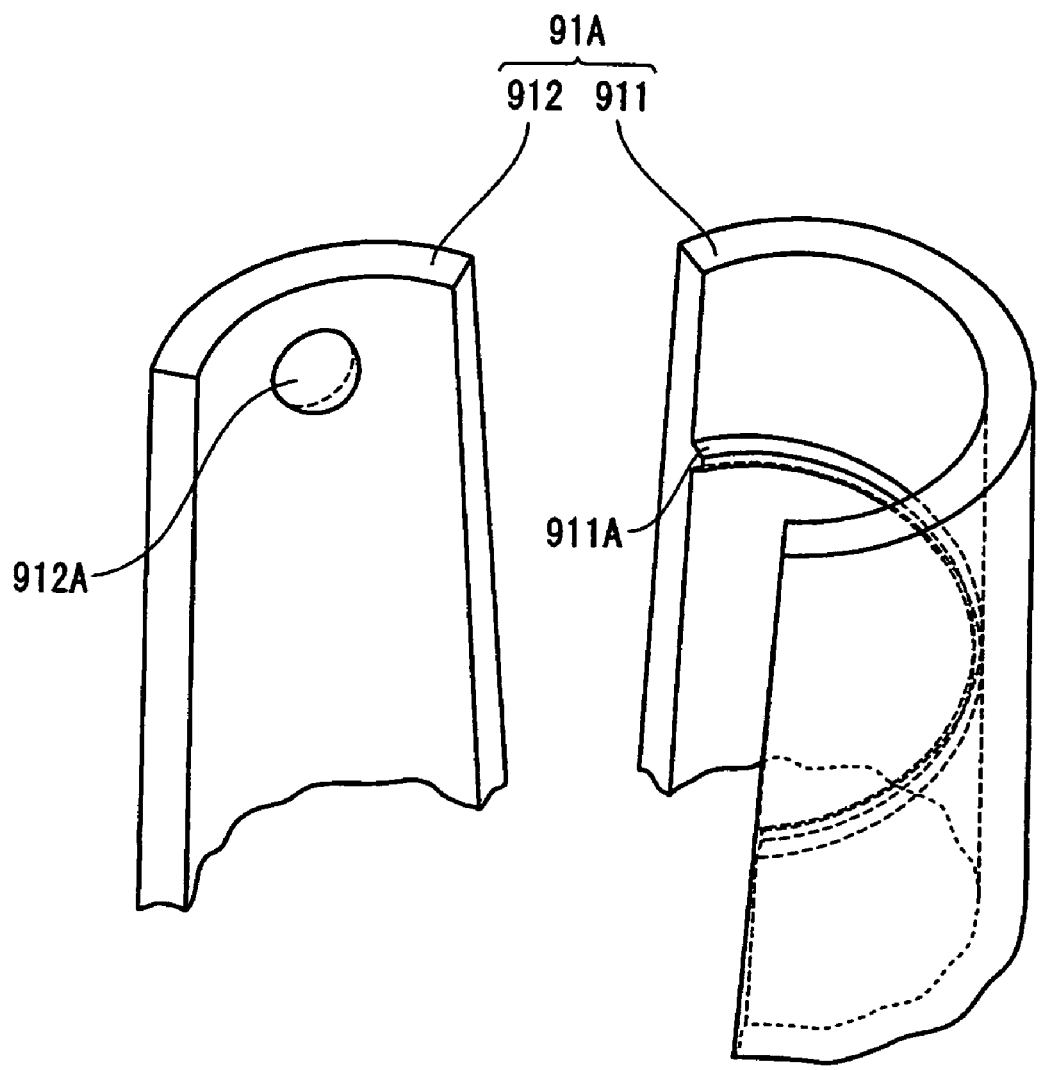

F I G. 9
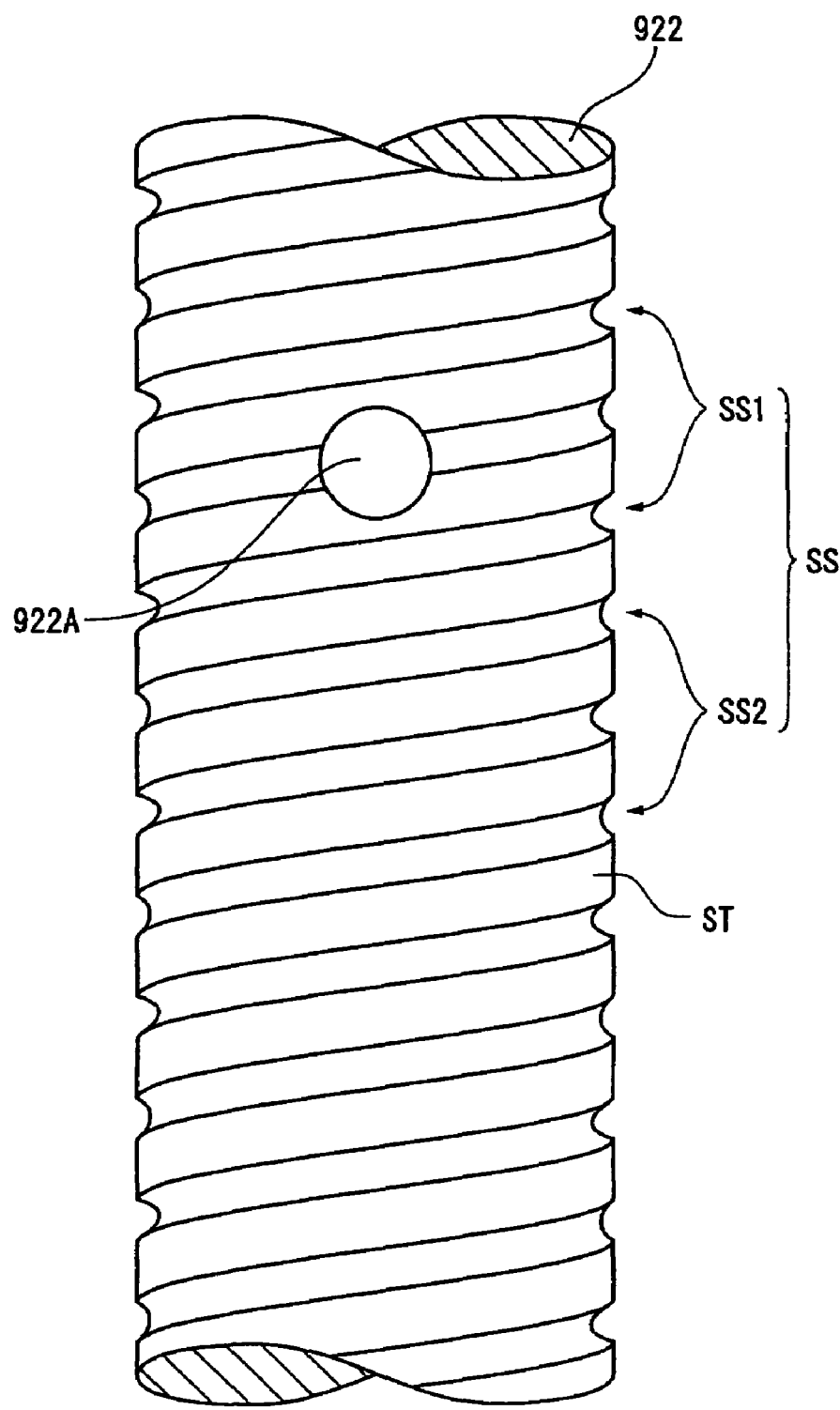

CASING FOR ELECTRONIC DEVICE AND PROJECTOR HAVING THIS CASING FOR ELECTRONIC DEVICE

BACKGROUND

Exemplary aspects of this invention relate to a casing for electronic device including a casing body that houses an electronic device and a foot part that is provided to be movable forward and backward from a surface of this casing body and to adjust inclination of the electronic device when installed on an installation target surface, and a projector having this casing for electronic device.

Projectors are used for presentations at conferences, meetings of academic societies, exhibitions and the like or for watching movies at home. In related art projectors, a luminous flux emitted from a light source provided within an armor case is modulated in accordance with image information to form an optical image, and this optical image is enlarged and projected.

As such a projector, a related art projector having a foot part to adjust inclination to properly project an optical image onto a screen or the like is disclosed in Registered Utility Model Publication No. U3095453. In such a projector, a fixed foot is provided at one end on a rear part and a foot part (foot member) for inclination adjustment is provided at the other end. A male screw part is formed on this foot part and this male screw part engages with a metal nut provided within an armor case. As this foot part for inclination adjustment is rotated in an axial direction, the male screw part of the foot part moves forward into or backward from the nut. Therefore, the quantity of projection of the foot part from the armor case is adjusted and inclination of the projector is thus adjusted.

SUMMARY

However, with the structure of the foot part described in Japanese Unexamined Patent Publication No. 2003-312, the nut must be formed by insertion molding when the casing is formed by injection molding or the like. This may complicate the process to mold the casing.

Also, since simple engagement between the bolt and nut is employed, a user may store the projector with the foot part for inclination adjustment sunk to the deepest part. Therefore, the next time the user uses the projector, the user must readjust the quantity of projection in relation to the fixed foot part, which causes inconvenience in the use of the projector.

Moreover, when packing and shipping such a projector after manufacturing, a spacer or the like must be inserted between the package and the foot part, corresponding to the quantity of projection of the fixed foot part, to prevent the projector from becoming shaky in the package. This causes a problem of excessive labor at the time of packing.

Exemplary aspects of this provide a casing for electronic devices and a projector that enable easy forming of a casing and also enables easy recognition of a reference position for the quantity of projection of a foot part for inclination adjustment.

A casing for electronic devices according to an exemplary aspect of this invention is a casing for electronic devices having a casing body that houses an electronic device and a foot part that is provided to be movable forward and backward from a surface of this casing body and to adjust inclination of the electronic device when installed on an installation target surface. The casing body has a boss formed to protrude on an inner surface of the casing body and has a hole formed on its inner surface connecting the inside and outside of the casing body. The foot part has a grounding part that is exposed from the casing for electronic device and abutted against the installation target surface and a shaft part housed within the boss and having a screw groove formed on its outer circumferential surface. A recess part is formed at a part of the screw groove of the shaft part, and a screw thread that engages with the screw groove of the shaft part and that extends in a circumferential direction of engagement without overlapping the circumference of the hole as viewed from the axial direction of the movement of the foot part. A protrusion to be fit with the recess part when the shaft part turns by a predetermined quantity with respect to the inner surface of the boss, is formed on the inner surface of the boss.

According to an exemplary aspect of this invention, the screw groove formed on the outer circumferential surface of the shaft part of the foot part engages with the screw threads formed on the inner surface of the boss. The foot part moves forward to and backward from the casing for the electronic device according to the turning of the shaft part in the axial direction. As the shaft part turns by a predetermined quantity, the recess part formed on the screw groove fits with the protrusion formed on the inner surface of the boss. Thus, as the recess part of the shaft part and the protrusion on the inner surface of the boss fit with each other, a reference position for the quantity of protrusion of the shaft part in the case of turning the shaft part by the predetermined quantity can be recognized. Therefore, the reference position for the quantity of projection of the foot part can be easily recognized and inclination of the casing for electronic device can be easily adjusted.

Moreover, since the screw thread formed on the inner surface of the boss is within the range of not overlapping on the circumference of the hole as viewed from the direction of moving forward and backward of the foot part, the screw thread can be easily formed on the inner surface of the boss.

In an exemplary aspect of this invention, the boss and the screw thread may be formed on its inner surface are integrally molded with the casing body made of synthetic resin.

According to an exemplary aspect of this invention, since the boss in which the shaft part of the foot part is housed is integrally molded with the casing body, the number of components of the casing for the electronic device can be reduced and the process to manufacture the casing for the electronic device can be simplified. Specifically, since the screw thread formed on the inner surface of the boss is within the range of not overlapping on the circumference of the hole as viewed from the direction of moving forward and backward of the foot part, when forming the casing body of synthetic resin by injection molding or the like, the screw thread can be formed at a contact part between molds and the molds can be easily separated. Therefore, the process to mold the casing for electronic device can be simplified.

In an exemplary aspect of this invention, the boss may be divided into a first part and a second part by two cut-out grooves extending in the direction of protrusion. The length of the first part of the boss in circumferential direction around the hole is larger than that of the second part, with the screw thread being formed on the inner surface of the first part and with the protrusion being formed on the inner surface of the second part.

According to an exemplary aspect of this invention, since the screw thread is formed on the inner surface of the first part having the larger length in the circumferential direction, the screw thread on the first part to engage with the screw groove formed on the shaft part of the foot part can be made large and the foot part can axially support the casing body stably.

Moreover, since the second part is separate from the first part, the second part can be made flexible in the direction of diameter of the boss. Here, the protrusion is formed on the second part. When the foot part is housed within the boss, the second part flexes outward in the direction of diameter and applies inward pressure to the shaft part of the foot part via the protrusion. In the case where the foot part is turned by a predetermined quantity and the recess part formed on the screw groove of the foot part is fitted with the protrusion, this pressure is canceled. Therefore, the presence/absence of this pressure can generate clicking touch in the turning of the foot part. Thus, the reference position for the quantity of protrusion of the foot part can be recognized more easily.

In an exemplary aspect of this invention, the screw groove of the shaft part may be a double-thread screw groove in which two screw grooves with different depths are formed. The deeper screw groove of the two screw grooves engages with the screw thread on the inner surface of the boss while the recess part is formed in the shallower screw groove.

According to an exemplary aspect of this invention, since the deeper screw groove is engaged with the screw thread formed on the inner surface of the boss, when the shaft part of the foot part is housed within the boss, the deeper screw groove and screw thread can be securely engaged with each other, and the engagement of the screw groove with the screw thread becomes deeper. Therefore, the casing body can be axially supported stably.

Moreover, since the shallower screw groove in which the recess part is formed is engaged with the protrusion formed on the inner surface of the boss, the engagement of the recess part in the screw groove and the protrusion by the turning of the foot part by a predetermined quantity can be securely carried out.

A projector according to an exemplary aspect of the invention is a projector to modulate a luminous flux emitted from a light source in accordance with image information to form an optical image and enlarging and projecting the formed optical image, characterized by having the above-described casing for electronic device.

According to an exemplary aspect of the invention, substantially similar effects to those of the above-described casing for electronic device can be achieved. Specifically, when emitting an optical image from the projector onto a screen or the like, inclination of the projector must be adjusted to achieve horizontally. When adjusting the inclination, the reference position for the quantity of protrusion of the foot part can be easily recognized. Therefore, adjustment of the height of the foot member and adjustment of the inclination of the projector can be easily carried out.

In an exemplary aspect of the invention, when the direction of projection of the projector is a front side, the foot part may be provided on a rear side of the casing for electronic device.

According to an exemplary aspect of this invention, since the above-described foot part is provided on the rear side of the casing for the electronic device opposite to the direction of projection, adjustment of the direction of projection of the optical image can be facilitated. Specifically, on the front side in the direction of projection of the projector, the direction of elevation must be adjusted so that the projected optical image is situated on the screen, and the angle in this direction of elevation is not uniform. However, as the foot part set on the basis of the horizontal position of the projector as the reference position for the quantity of protrusion of the foot part is provided on the rear side opposite to the direction of projection of the projector, adjustment of inclination of the projector in the horizontal direction is made easier and adjustment of the direction of projection of the optical image can be carried out easily.

BRIEF DESCRIPTION OF THE DRAWINGS

FIG. 7 is a schematic showing a second attitude adjustment mechanism in the above-described exemplary embodiment;

FIG. 8 is a schematic showing a first part and a second part in the above-described exemplary embodiment; and FIG. 9 is a schematic showing a shaft part of a foot member in the above-described exemplary embodiment.

DETAILED DESCRIPTION OF EXEMPLARY EMBODIMENTS

Hereinafter, an exemplary embodiment of this invention will be described with reference to the drawings.

Structure of Project

Figure 1:
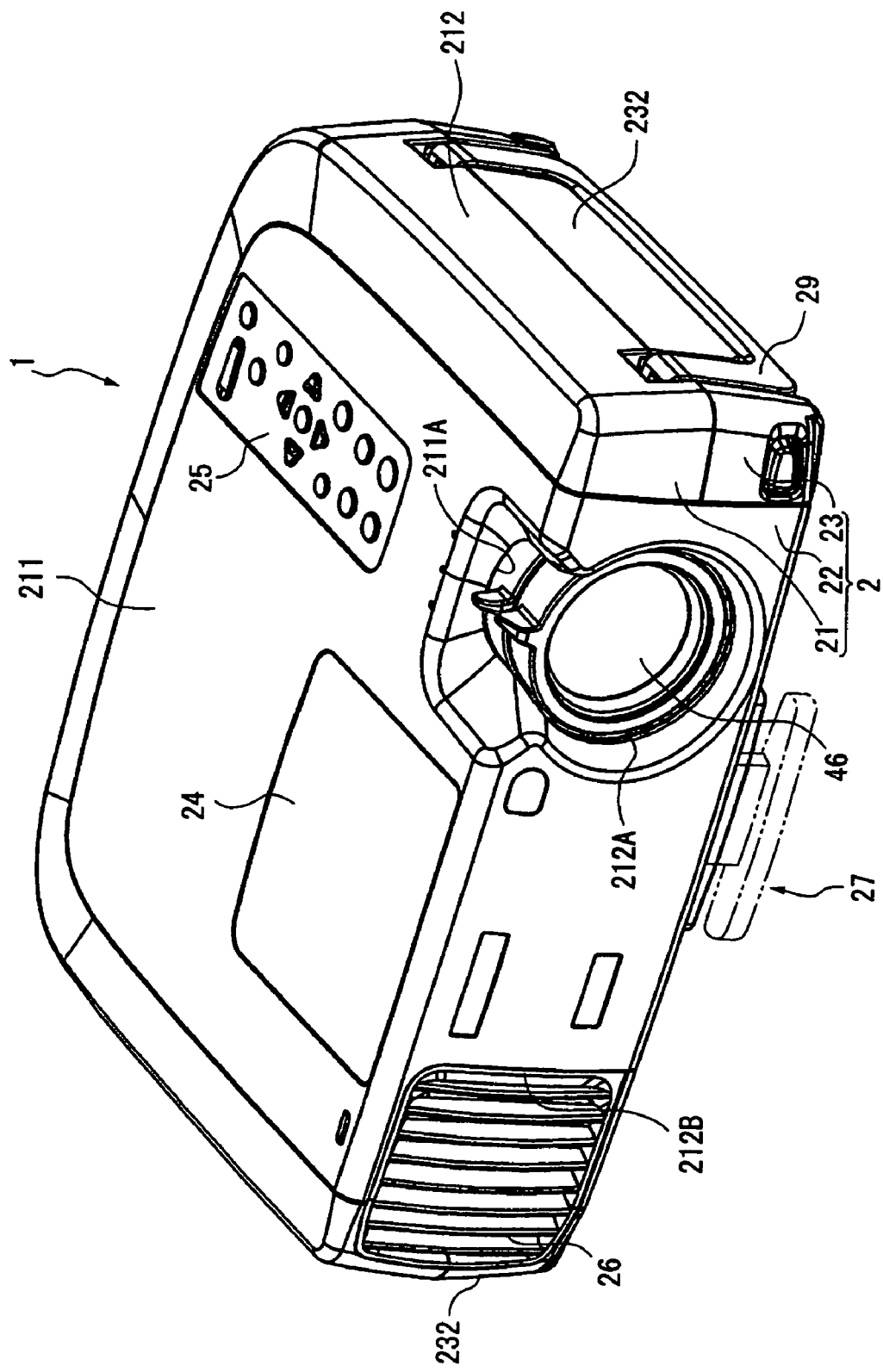
FIG. 1 is a schematic of a projector according to an exemplary embodiment of this invention, as viewed from above.
Figure 2:
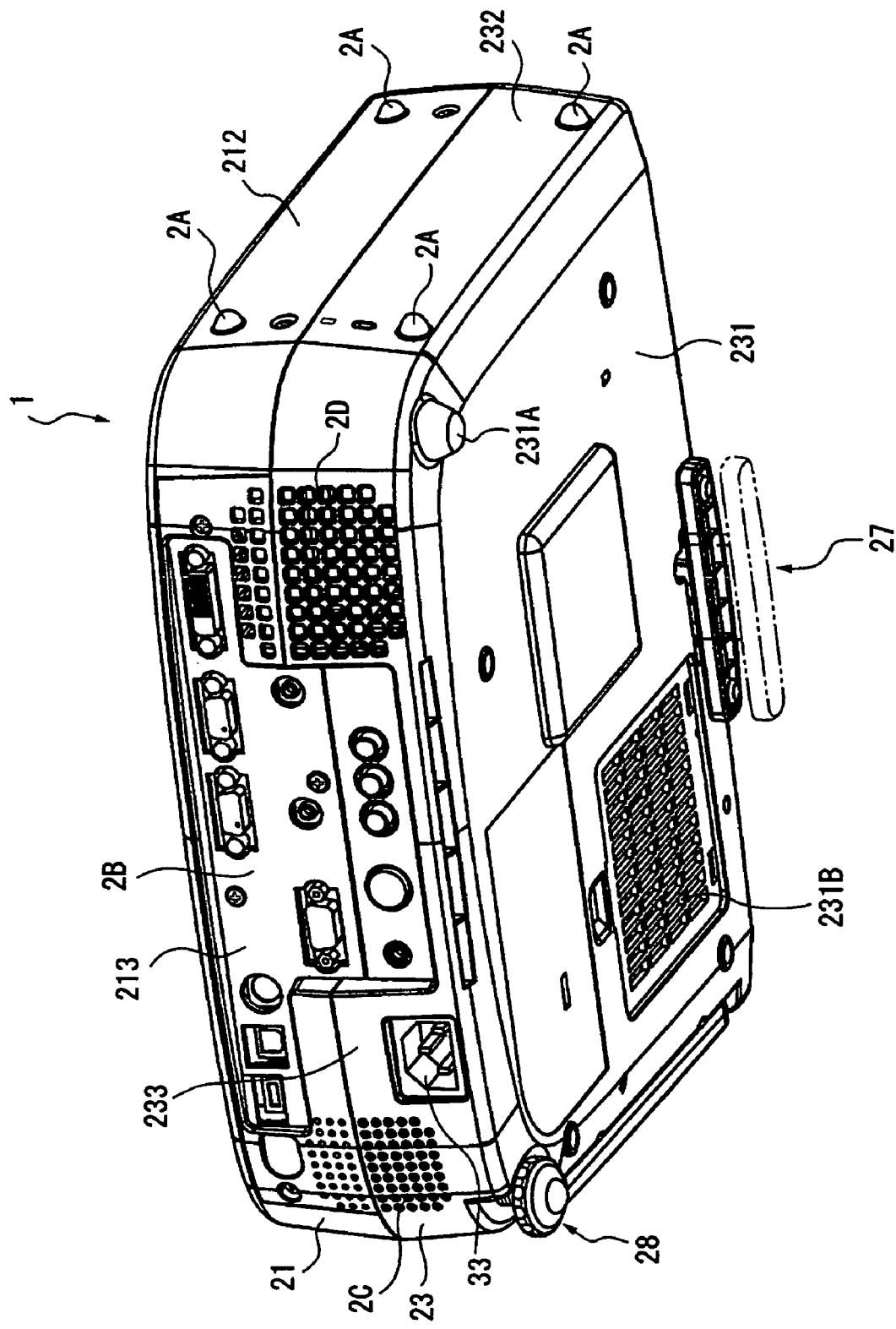
FIG. 2 is a schematic of the projector according to the above-described exemplary embodiment, as viewed from below.
Figure 3:
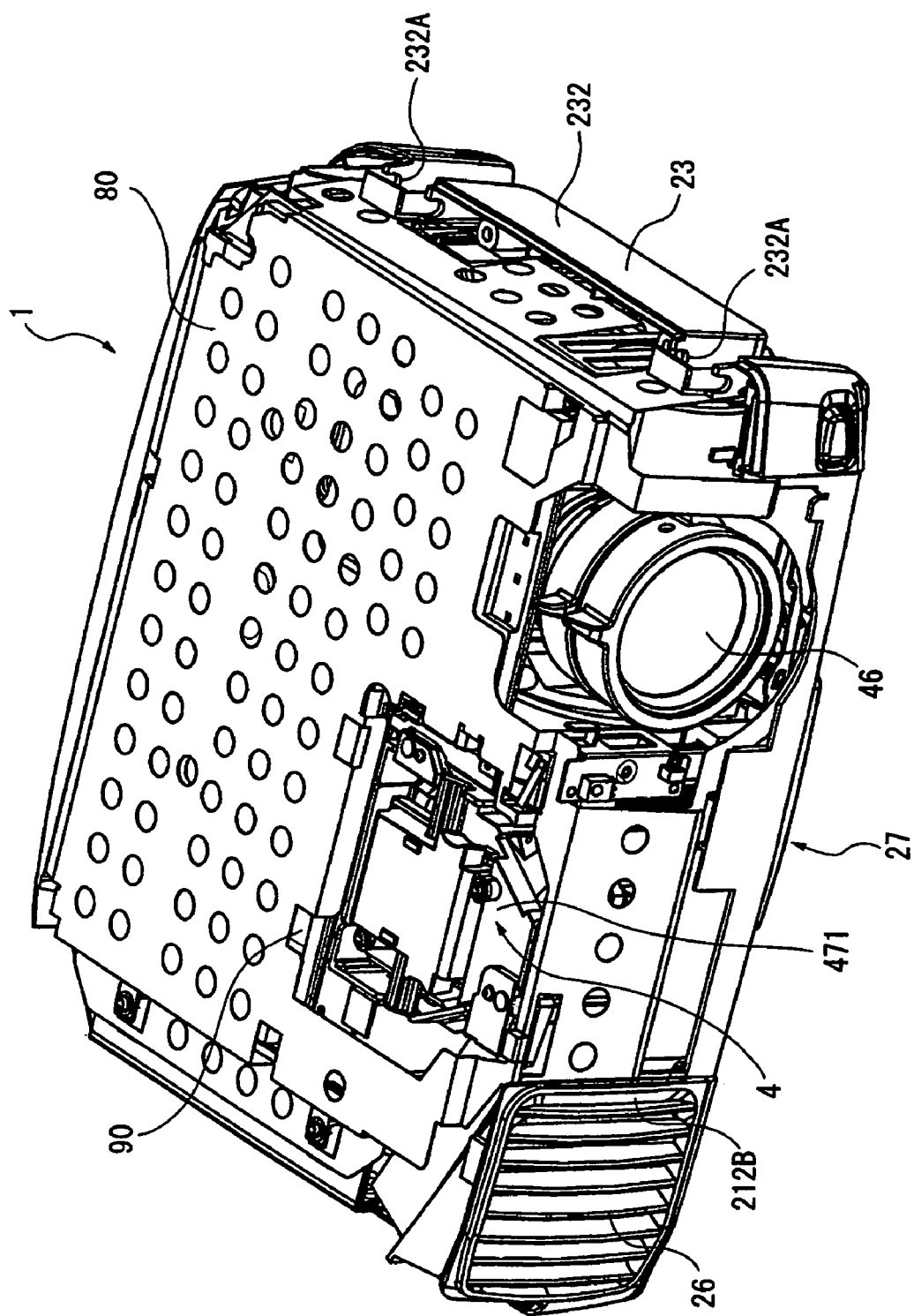
FIG. 3 is a schematic of a state where an upper case is detached from the state of FIG. 1.
Figure 4:
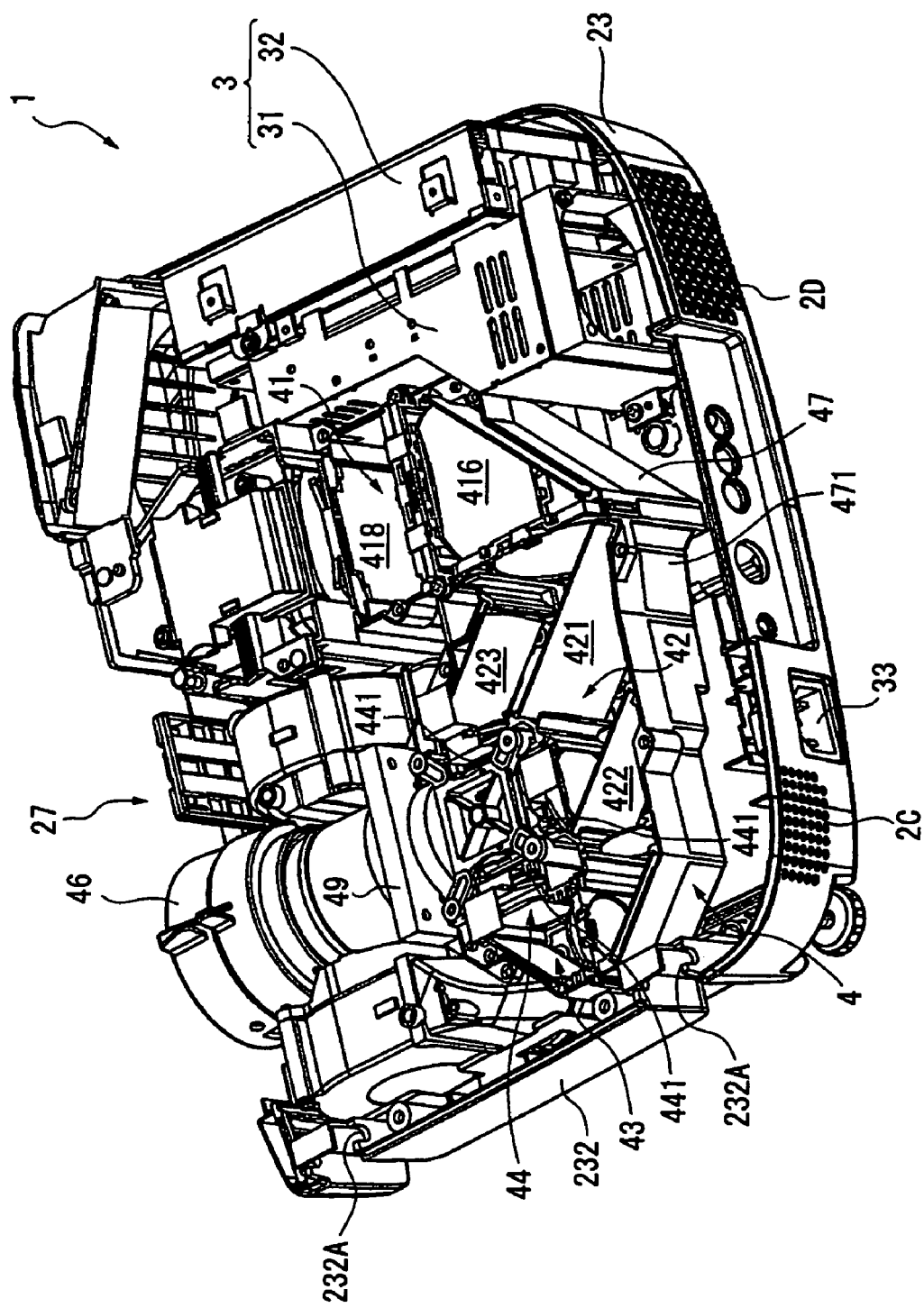
FIG. 4 is a schematic of a state where a shield plate and a driver board are detached from the state of FIG. 3, as viewed from the rear side.
Figure 5:
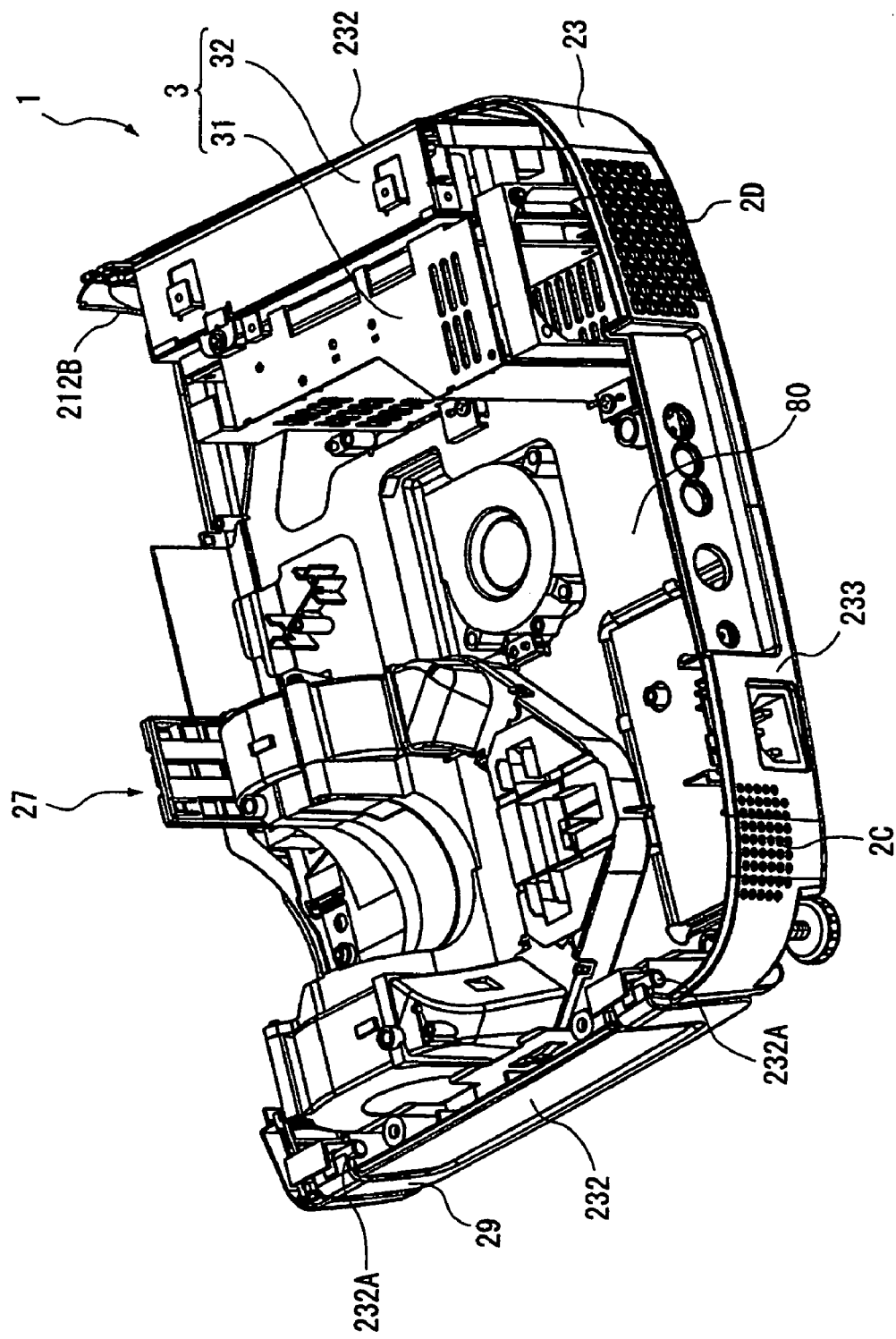
FIG. 5 is a schematic of a state where an optical unit is detached from the state of FIG. 4.

FIG. 1 is a schematic of a projector 1 according to an exemplary embodiment, as viewed from above. FIG. 2 is a schematic of the projector 1, as viewed from below. FIGS. 3 to 5 are schematics showing the inside of the projector 1. Specifically, FIG. 3 is a schematic in the case where an upper case 21 of the projector 1 is removed. FIG. 4 is a schematic in the case where a shield plate 80 and a driver board 90 and the like are removed from the state of FIG. 3, as viewed from the rear side. FIG. 5 is a schematic in the case where an optical unit 4 is removed from the state of FIG. 4.

As shown in FIGS. 1 to 3, the projector 1 includes an electronic device has an armor case 2, which is a casing for electronic device, a power supply unit 3 housed within the armor case 2, and an optical unit 4 also arranged within the armor case 2 and having a U-shape as viewed on a plane. The projector 1 has a substantially rectangular solid-like shape as a whole.

The armor case 2 is formed by an upper case 21, a front case 22, a lower case 23 and an interface cover 213, each of which may be made of synthetic resin. The upper case 21 and the front case 22 are integrally formed. The interface cover 213 is arranged on the rear side of the projector 1.

The upper case 21 is formed by a top part 211 and a lateral part 212 provided around the top part.

On the front side of the top part 211, a lamp cover 24 is removably mounted in an embedding manner. Also in the top part 211, a cut-out part 211A exposing a top part of a projection lens 46 is provided laterally next to the lamp cover 24 so that zooming operation and focusing operation of the projection lens 46 can be manually carried out with a lever. On the rear side behind this cut-out part 211A, an operating panel 25 is provided.

On the front case 22, a circular opening 212A continuing to the cut-out part 211A of the upper case 21 is provided, and the projection lens 46 is arranged corresponding to this circular opening 212A. On the side opposite to the circular opening 212A, an exhaust port 212B is provided situated on the front side in front of the inner power supply unit 3. In this exhaust port 212B, an exhaust louver 26 is provided which exhausts cooling air in a direction away from an image projection area, specifically, toward left in FIG. 1, and also performs shielding from light.

The lower case 23 is formed by a bottom part 231, and lateral parts 232 and a rear part 233, which are provided around the bottom part.

On the front side of the bottom part 231, a first attitude adjustment mechanism 27 to adjust the inclination of the projector 1 in the front-and-rear direction and thus aligning the position of a projection image is provided. At one corner on the rear side of the bottom part 231, a second attitude adjustment mechanism 28 to adjust the inclination of the projector 1 in the left-and-right direction substantially orthogonal to the front-and-rear direction is provided. At the other corner, a rear foot 231A is provided, which is not capable of adjusting the position but is a fixed foot corresponding to the second attitude adjustment mechanism 28. The second attitude adjustment mechanism 28 will be described later in detail.

Moreover, an intake port 231B for cooling air is provided on the bottom part 231.

On one of the lateral parts 232, attachment parts 232A to attaching a U-shaped handle 29 in such a manner that the handle can turn freely are provided.

On one lateral side of such an armor case 2, side feet 2A (FIG. 2) that serve as feet when the projector 1 is put upright with the handle 29 situated on the top, are provided on the lateral parts 212, 232 of the upper case 21 and the lower case 23.

On the rear side of the armor case 2, an interface part 2B formed by a recess part extending on the interface cover 213 and the rear part 233 of the lower case 23 is provided. On the inner side of the interface part 2B, an interface board having various connectors mounted thereon, not shown, is arranged. To the left and right of the interface part 2B, speaker holes 2C and an intake port 2D are provided extending on the interface cover 213 and the rear part 233 of the lower case 23. Of these, the intake port 2D is situated on the rear side behind the inner power supply unit 3.

The power supply unit 3 includes a power source 31 and a lamp driving circuit (ballast) 32 arranged laterally next to the power source 31, as shown in FIG. 4.

The power source 31 is to supply power supplied through a power supply cable, to the lamp driving circuit 32, a driver board 90 (FIG. 3) and the like, and has an inlet connector 33 (FIG. 2) in which the power supply cable is inserted.

The lamp driving circuit 32 is to supply power to a light source lamp 411 of the optical unit 4.

Figure 6:
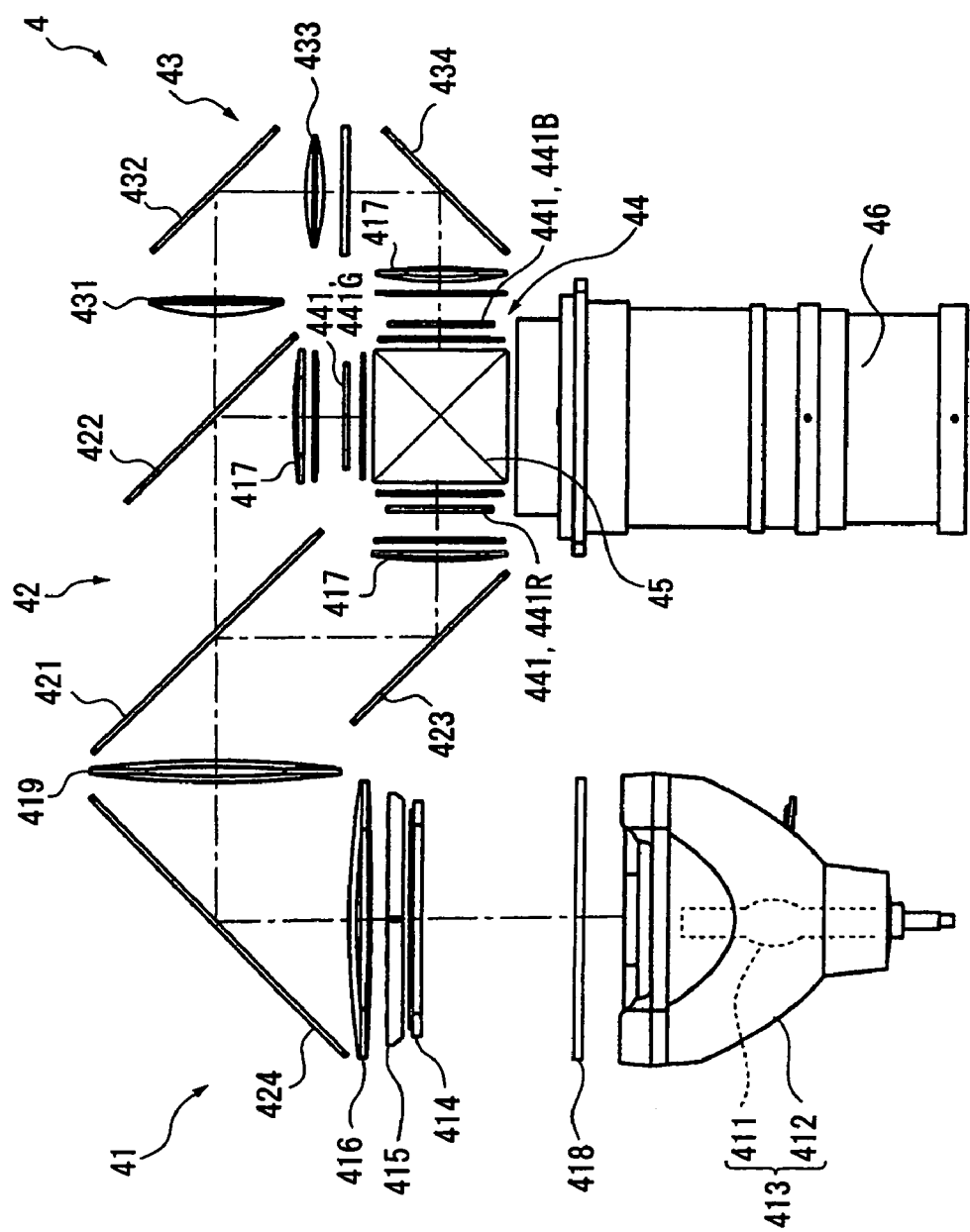
FIG. 6 is a schematic of the optical unit in the above-described exemplary embodiment.

The optical unit 4 is a unit to optically processing a luminous flux emitted from the light source lamp 411 and thus forming an optical image corresponding to image information, as shown in FIGS. 4 and 6. It has an integration illumination system 41, a color separation system 42, a relay system 43, an electro-optical device 44, a cross dichroic prism 45 as a light combining system (FIG. 6), and the projection lens 46 as a projection system.

The power supply unit 3 and optical unit 4 are covered by an aluminum shield plate 80 (FIGS. 3 and 5) that surrounds these units including top and bottom parts. This reduces or prevents leakage of electromagnetic noise from the power supply unit 3 and the like to the outside.

2. Detailed Structure of Optical System

As shown in FIGS. 4 and 6, the integration illumination system 41 is an optical system to substantially uniformly illuminate image forming areas of three liquid crystal panels 441 (referred to as liquid crystal panels 441R, 441G and 441B corresponding to red, green and blue, respectively) constituting the electro-optical device 44. It has a light source 413, a first lens array 418, a second lens array 414, a polarization conversion element 415, a first condenser lens 416, a reflection mirror 424, and a second condenser lens 419.

Of these components, the light source 413 has the light source lamp 411 as a radiation light source to emit radial beams, and a reflector 412 to reflect radial light emitted from the light source lamp 411. As the light source lamp 411, a halogen lamp, metal halide lamp, or high-pressure mercury lamp is often used. As the reflector 412, a parabolic mirror is used. Other than a parabolic mirror, an elliptic mirror together with a parallelizing lens (concave lens) may be used.

The first lens array 418 has such a structure that small lenses having substantially rectangular contour as viewed from the direction of the optical axis are arranged into a matrix. Each small lens splits the luminous flux emitted from the light source lamp 411 into plural partial luminous fluxes. The contour shape of each small lens is set to be substantially similar to the shape of the image forming areas of the liquid crystal panels 441.

The second lens array 414 has a structure similar to that of the first lens array 418. It has such a structure that small lenses are arrayed into a matrix. The second lens array 414 has a function to form the image of each small lens of the first lens array 418 onto the liquid crystal panels 441, together with the first condenser lens 416 and the second condenser lens 419.

The polarization conversion element 415 is arranged between the second lens array 414 and the first condenser lens 416 and is integrated with the second lens array 414 to form a unit. Such a polarization conversion element 415 is to convert light from the second lens array 414 to polarized light of one type. This enhances the efficiency of use of light in the electro-optical device 44.

Specifically, each partial light converted to polarized light of one type by the polarization conversion element 415 is ultimately to be substantially superimposed on the liquid crystal panels 441R, 441G and 441B of the electro-optical device 44 by the first condenser lens 416 and the second condenser lens 419. In the projector 1 (electro-optical device 44) of this exemplary embodiment using the liquid crystal panels 441 of the type of modulating polarized light, only polarized light of one type can be used and substantially a half of the light from the light source lamp 411 that emits random polarized light of other types is not used.

Thus, using the polarization conversion element 415, all the light emitted from the light source lamp 411 is converted to polarized light of one type and the efficiency of use of light in the electro-optical device 44 is enhanced. Such a polarization conversion element 415 is described, for example, in JP-A-8-304739.

The color separation system 42 has two dichroic mirrors 412, 422 and a reflection mirror 423. It has a function to separate plural partial luminous fluxes emitted from the integration illumination system 41 into color light beams of three colors, that is, red, green and blue, by the dichroic mirrors 421, 422.

The relay system 43 has a light incident-side lens 431, a relay lens 433, and reflection mirrors 432, 434. It has a function to guide color light separated by the color separation system 42, specifically, blue light, to the liquid crystal panel 441B.

In this case, the dichroic mirror 421 of the color separation system 42 transmits a blue light component and a green light component of the luminous flux emitted from the integration illumination system 41 and reflects a red light component. The red light reflected by the dichroic mirror 421 is reflected by the reflection mirror 423, passes through a field lens 417 and reaches the liquid crystal panel 441R for red. This field lens 417 converts each partial luminous flux emitted from the second lens array 414 to a luminous flux parallel to its central axis (main beam). The field lenses 417 provided on the light incident sides to the other liquid crystal panels 441G and 441B operate similarly.

Of the blue light and green light transmitted through the dichroic mirror 421, the green light is reflected by the dichroic mirror 422, passes through the field lens 417 and reaches the liquid crystal panel 441G for green. The blue light is transmitted through the dichroic mirror 422, passes through the relay system 43, further passes through the field lens 417 and reaches the liquid crystal panel 441B for blue light. The purpose of using the relay system 43 for the blue light is to prevent lowering of the efficiency of use of light due to spreading of light or the like because of the optical path length of the blue light that is longer than the optical path lengths of the other color lights. Specifically, the purpose is to transmit the partial luminous flux incident on the light incident-side lens 431 to the field lens 417 as it is. Although the relay system 43 has a structure to transmit the blue light of the three color lights, it is not limited to this structure and may also have, for example, a structure to transmit the red light.

The electro-optical device 44 has the liquid crystal panels 441R, 441G and 441B to be three light modulators. These panels use, for example, polysilicon TFTs as their switching elements. Each color light separated by the color separation system 42 is modulated by these three liquid crystal panels 441R, 441G and 441B in accordance with image information and thus forms an optical image.

The cross dichroic prism 45 combines images modulated for each color light emitted from the three liquid crystal panels 441R, 441G and 441 B, and thus forming a color image. In the cross dichroic prism 45, a dielectric multilayer film to reflect red light and a dielectric multilayer film to reflect blue light are formed substantially in an X-shape along the boundaries of four right-angled prisms, and these dielectric multilayer films combine the three color lights. Then, the color image combined by the prism 45 is emitted from the projection lens 46 and enlarged and projected onto the screen.

The optical systems 41 to 45 described above are housed in an optical component casing 47 as an optical component casing made of synthetic resin, as shown in FIG. 4.

This optical component casing 47 includes a component housing member 471 in which groove parts to fit the above-described optical components 414 to 419, 421 to 423 and 431 to 434 in a sliding manner from above are provided, and a cover member, not shown, having a cover shape to close an upper opening side of the component housing member 471.

A head part 49 is formed on the light exiting side of the optical component casing 47. The projection lens 46 is fixed on the front side in front of the head part 49, and the prism 45 having the liquid crystal panels 441R, 441G and 441B attached thereon is fixed behind the head part 49.

3. Structure of Second Attitude Adjustment Mechanism

FIG. 7 is a schematic showing the structure of the second attitude adjustment mechanism 28. FIG. 8 is a schematic of a boss 91 constituting the second attitude adjustment mechanism 28.

The second attitude adjustment mechanism 28 has a boss 91 formed on the inner surface of the lower case 23 forming the casing body, and a foot member 92, which is a foot part housed in the boss 91 in such a manner that it can turn freely and moving forward to and backward from the bottom part 231 of the lower case 23 as it turns, as shown in FIG. 7.

The boss 91 is a substantially cylindrical part integrally formed within the lower case 23 to surround a hole, not shown, connecting the inside and outside of the lower case 23. This boss 91 has a boss body 91A in which the foot member 92 is housed through the above-described hole, and a pedestal part 91B to stabilize this boss body 91A in the lower case 23. Of these parts, the pedestal part 91B is formed to surround the boss body 91A, and reinforcing ribs 91B1 are formed at four positions substantially at equal intervals to connect the boss body 91A to the lower case 23.

The boss body 91A has a first part 911 and a second part 912 formed by splitting by two cut-out grooves 913 formed in the cylindrical direction, as shown in FIGS. 7 and 8.

The first part 911 is formed to have a larger arc length than the second part 912 in the circumferential direction surrounding the above-described hole. On the inner surface of this first part 911, one screw thread 911A is formed. Specifically, this screw thread 911A is formed within a range not overlapping on the circumference of the hole, as viewed from the axial direction of the boss 91, specifically, the direction of moving forward and backward of the foot member 92.

On the second part 912, a hemispherical protrusion 912A is formed above the screw thread 911A formed on the first part 911. This protrusion 912A is formed on a screw groove corresponding to a virtual screw thread formed by extending the screw thread 911A formed on the first part 911 to the second part 912. This second part is flexible and can flex outward in the direction of diameter as viewed from the axial direction of the boss 91.

According to such a boss 91, the boss 91 can be molded together with the lower case 23 when molding the lower case 23 made of synthetic resin. Therefore, it is possible to reduce the number of components, simplify the structure of the second attitude adjustment mechanism 28 including the boss 91, and reduce the number of steps to manufacture the second attitude adjustment mechanism 28 and hence the lower case 23.

Moreover, since the screw thread 911A formed on the first part 911 is formed within the range of not overlapping on the circumference of the hole as viewed from the axial direction of the boss 91, the separation of the mold can be facilitated when molding the lower case 23 and therefore the manufacture of the lower case 23 can be carried out more easily.

The foot member 92 is to move forward to and backward from the bottom part 231 of the lower case 23 to adjust the inclination of the projector 1, as described above. This foot member 92 has a substantially disk-shaped grounding part 921, a shaft part 922 extending coaxially from the top side of this grounding part 921, and a stopper part 923 formed at the upper end of this shaft part 922, as shown in FIG. 7.

The grounding part 921 is a part having its bottom abutted against a grounded surface, such as a pedestal, and it is exposed from the bottom part 231 of the lower case 23. On the outer circumference of this grounding part 921, recesses and protrusions to facilitate the turning of the foot member 92 are formed.

The shaft part 922 is a part housed within the boss 91 in such a manner that it can freely turn in the axial direction. On the outer circumference of this shaft part 922, a screw groove SS is formed along the axial direction. The dimension of this shaft part 922 in the axial direction is larger than the dimension of the boss body 91A in the axial direction.

In the stopper part 923, two L-shaped parts 923A are provided which protrude in the direction of forming the shaft part 922 from the upper end of the shaft part 922 and extend at their distal ends into a direction substantially orthogonal to the direction of protrusion to be larger than the outer diameter of the shaft part 922. These L-shaped parts 923A are flexible and they flex inward when the shaft part 922 is housed into the boss 91. When the L-shaped parts 923A have reached the upper end of the boss body 91A, their flexure is canceled. This reduces the likelihood or prevents the foot member 92 from falling out of the boss 91.

FIG. 9 is a schematic of the shaft part 922.

On the outer circumference of the shaft part 922, the above-described screw groove SS and a screw thread ST are formed. This screw groove SS includes two screw grooves, specifically, a screw groove SS1 having a smaller root diameter and a screw groove SS2 having a larger root diameter. Specifically, screw groove SS is formed by the deeper screw groove SS1 and the shallower screw groove SS2.

The screw groove SS1 engages with the screw thread 911A formed on the first part 911 of the boss body 91A. Here, the root diameter of the screw groove SS1 is substantially coincident with the inner diameter of the screw thread 911A of the first part 911, which is a female screw. Also, the inner diameter of the boss body 91A, specifically, the root diameter in the case where the boss body 91A is assumed to be a female screw, is substantially coincident with the outer diameter of the shaft part 922, as described above. Thus, the screw thread 911A can be securely engaged with the deeper screw groove SS1.

Moreover, since the screw groove SS1 is deeper than the screw groove SS2, by engaging the screw thread 911A of the boss 91 with this screw groove SS1, deeper engagement of the screw groove SS1 with the screw thread 911A is realized. Thus, the lower case 23 can be axially supported stably and the attitude of the projector 1 can be stably adjusted.

The screw groove SS2 engages with a distal end part of the protrusion 912A formed on the second part 912. At one position on the screw groove SS2, a recess part 922A is formed extending from the screw groove SS2 at its center to the parts of the screw thread ST provided above and below the screw groove SS2.

The protrusion 912A fits with the recess part 922A. Therefore, the recess part 922A is formed in a hemispherical recessed shape corresponding to the substantially hemispherical shape of the protrusion 912A. This recess part 922A is formed at a position that realizes installation of the projector 1 on a horizontally flat installation target surface and realizes horizontality of the projector 1 when the protrusion 912A fits in the recess part 922A. Thus, the position where the recess part 922A fits with the protrusion 912A can be used as a reference position for the quantity of protrusion of the foot member 92 that realizes horizontality of the projector 1. This reference position can be confirmed by the fitting of the recess part 922A with the protrusion 912A.

Here, the second part 912 is flexible and the protrusion 912A is formed on the inner surface of the second part 912, as described above. Therefore, when the shaft part 922 of the foot member 92 is housed within the boss 91, the second part 912 flexes outward in the direction of diameter of the boss 91 and the protrusion 912A applies pressure to the shaft part 922 via the engaged screw groove SS2. This enables secure engagement of the protrusion 912A with the screw groove SS2, and the shaft part 922 of the foot member 92 can be maintained. This pressure is relaxed when the protrusion 912A is fitted in the recess part 922A formed on the screw groove SS2. Therefore, the pressure changes between when the protrusion 912A is fitted in the recess part 922A and when the 912A is not fitted in the recess part 922A, and clicking touch can thus occur. Thus, the user can easily recognize the quantity of protrusion of the foot member 92 when the above-described reference position is reached.

Also, since this screw groove SS2 is shallow, the protrusion 912A does not deeply engage with the screw groove SS2. Therefore, obstruction to the screwing in and out of the shaft part 922 can be restrained.

Moreover, since the second attitude adjustment mechanism 28 is provided on the rear side of the lower case 23, the inclination of the projector 1 can be easily adjusted. The above-described first attitude adjustment mechanism 27 provided on the front side adjusts the attitude of the projector 1 in the direction of elevation to display an optical image onto the screen. But this attitude in the direction of elevation is not uniform and varies depending on the position of the screen and the position on the installation target surface where the projector 1 is installed. The second attitude adjustment mechanism 28 provided on the rear side adjusts the attitude of the projector 1 in the horizontal direction, irrespective of the attitude adjustment in the direction of elevation. In the adjustment of the inclination of the projector 1 in the horizontal direction, the reference position for the quantity of projection due to the turning of the foot member 92 of a predetermined quantity can be recognized through the clicking touch by the engagement of the protrusion 912A formed on the boss 91 and the recess part 922A formed on the foot member 92. Therefore, the inclination of the projector 1 in the horizontal direction can be easily adjusted and the adjustment of the direction of projecting an optical image can be simplified.

4. Modification of Exemplary Embodiment

This invention is not limited the above-described exemplary embodiments and includes modifications, enhancements and the like without departing from the scope of this invention.

In the above-described exemplary embodiment, the boss 91 constituting the second attitude adjustment mechanism 28 is integrally molded with the lower case 23. However, the boss 91 may be attached as a separate member to the lower case 23, using an adhesive or the like. In this case, a hole may be provided in the molded lower case 23 and the boss 91 may be attached to house the foot member 92 inserted through the hole. As the boss 91 is integrally molded with the lower case 23, the number of components of the projector 1 can be reduced and the construction of the second attitude adjustment mechanism 28 can be easily carried out, as described above.

Also, while the lower case 23 and the second attitude adjustment mechanism 28 are made of synthetic resin, their material is not limited to this and these parts may be made of metal. If the lower case 23 and the second attitude adjustment mechanism 28 are made of metal, high strength can be maintained. If the lower case 23 and the second attitude adjustment mechanism 28 are made of synthetic resin, they can be integrally molded, enabling easy manufacture of the case as well as reduction in weight.

In the above-described exemplary embodiment, the boss 91 is split into the first part 911 and the second part 912 by the two cut-out grooves 913 formed in the cylindrical direction. However, the boss may be formed by a single cylindrical boss, and a screw thread and a protrusion may be formed on the inner surface of this boss. In the case of the boss 91 formed by the first part 911 and the second part 912, the second part 912, which has a shorter arc length and has the protrusion 912A formed thereon, can be flexible. This enables secure fitting of the protrusion 912A in the recess part 922A formed on the shaft part 922 of the foot member 92.

In the above-described exemplary embodiment, the two screw grooves SS1 and SS2 having different depths are formed on the shaft part 922 of the foot member 92. However, a single screw groove may be formed and a recess part may be formed at a predetermined position in this screw groove. In this case, the protrusion 912A may be formed on a virtual screw thread formed by extending the screw thread 911A formed on the first part 911 to the second part 912. This enables simplification of the structure of the foot member 92. In the case of the foot member 92 having the shaft part 922 including the two screw grooves SS1 and SS2, the foot member 92 can axially support the lower case 23 stably because the deeper screw groove SS1 engages with the screw thread 911A, and obstruction to the screwing in and out of the foot member 92 can be reduced or prevented because the shallower screw groove SS2 engaged with the protrusion.

While the second attitude adjustment mechanism 28 is provided on the rear side of the lower case 23 in the above-described exemplary embodiment, it may be provided on the front side. Specifically, the second attitude adjustment mechanism 28 may be provided for adjusting the attitude in the direction of elevation. As the second attitude adjustment mechanism 28 is provided on the rear side of the lower case 23, the inclination of the projector 1 can be easily adjusted, as described above.

While only the projector using the three liquid crystal panels 441 is described as an example in the above-described exemplary embodiment, this invention may also applicable to a projector using four or more liquid crystal panels.

Also, while the liquid crystal panels 441 are used as light modulators, other light modulators than liquid crystal devices, for example, a device using a micro mirror, may be used.

Moreover, transmissive liquid crystal panels in which the light incident surface and the light exiting surface are different, are used as the liquid crystal panels in the above-described exemplary embodiments. However, reflective liquid crystal panels in which the light incident surface and the light exiting surface are the same may be used.

While the projector 1 is employed as an electronic device in the above-described exemplary embodiment, this invention is not limited to this. Any electronic device that requires adjustment of inclination when it is installed on an installation target surface, can be employed. For example, the casing for an electronic device according to an exemplary aspect of this invention may be employed as a casing of a television or the like.

INDUSTRIAL APPLICABILITY

Exemplary aspects of this invention can be applied to a projector and can also be applied to an electronic device that requires adjustment of inclination when it is installed.

What is claimed is:

1. A casing for an electronic device, comprising:
  a casing body that houses the electronic device; and
  a foot part that is provided to be movable forward and backward from a surface of the casing body and to adjust inclination of the electronic device when installed on an installation target surface;
  the casing body including a boss formed to protrude on an inner surface of the casing body and having a hole formed through the casing body, the hole connecting an inside and an outside of the casing body,
  the foot part including:
    a grounding part that is exposed from the casing for the electronic device and abuts against the installation target surface,
    a shaft part housed within the boss and having a screw groove formed on its outer circumferential surface, the screw groove of the shaft part being a double-thread screw groove in which two screw grooves with different depths are formed, the deeper screw groove of the two screw grooves engaging with the screw thread on an interior surface of the boss, and
    a recess part being formed in the shallower screw groove of the two screw grooves, and
  the boss including:
    the interior surface and an exterior surface,
    a screw thread on the interior surface engaging with the screw groove of the shaft part and extending in a circumferential direction of engagement without overlapping a circumference of the hole as viewed from the axial direction of the movement of the foot part,
    the screw thread not extending around the entire circumference of the interior surface of the boss as viewed from the axial direction of the movement of the foot part, and
    a protrusion, to be fit with the recess part when the shaft part turns by a predetermined quantity with respect to the interior surface of the boss, being formed on the interior surface of the boss.

2. The casing for an electronic device as claimed in claim 1, the boss and the screw thread formed on the interior surface being integrally molded with the casing body made of synthetic resin.

3. The casing for an electronic device as claimed in claim 1,
  the boss being divided into a first part and a second part by two cut-out grooves extending in the direction of protrusion,
  the length of the first part of the boss in a circumferential direction around the hole being larger than that of the second part, and
  the screw thread being formed on an interior surface of the first part and the protrusion being formed on an interior surface of the second part.

4. A projector to modulate a luminous flux emitted from a light source in accordance with image information to form an optical image and enlarging and projecting the formed optical image, the projector comprising:
  the casing for an electronic device as claimed in claim 1.

5. The projector as claimed in claim 4, when the direction of projection of the projector is toward a front side, the foot part being provided on a rear side of the casing for an electronic device.

* * * * *